(12) United States Patent
Martin

(10) Patent No.: US 6,499,647 B1
(45) Date of Patent: Dec. 31, 2002

(54) METHOD FOR PRODUCING CONTACT BETWEEN TWO CIRCUIT LAYERS SEPARATED BY AN INSULATING LAYER

(76) Inventor: Philippe Martin, 23, rue du Doloire, Beaune 21200 (FR)

(*) Notice: Subject to any disclaimer, the term of this patent is extended or adjusted under 35 U.S.C. 154(b) by 0 days.

(21) Appl. No.: 09/743,554
(22) PCT Filed: Apr. 25, 2000
(86) PCT No.: PCT/FR00/01098
§ 371 (c)(1), (2), (4) Date: Jan. 9, 2001
(87) PCT Pub. No.: WO00/69237
PCT Pub. Date: Nov. 16, 2000

(30) Foreign Application Priority Data

May 10, 1999 (FR) .............................. 99 05940

(51) Int. Cl.[7] .................................. B23K 1/06
(52) U.S. Cl. ................... 228/110.1; 228/190
(58) Field of Search .................... 228/110.1, 112.1, 228/173.6, 174, 190; 156/73.1, 73.2, 73.4, 379.6, 379.8

(56) References Cited

U.S. PATENT DOCUMENTS

| | | | |
|---|---|---|---|
| 3,681,176 A | * | 8/1972 | Reifenhauser et al. |
| 4,251,303 A | * | 2/1981 | Diemel et al. |
| 4,576,900 A | * | 3/1986 | Chiang |
| 4,599,123 A | * | 7/1986 | Christensson |
| 4,766,420 A | * | 8/1988 | Hastings et al. |
| 4,849,857 A | * | 7/1989 | Butt et al. |
| 4,956,031 A | * | 9/1990 | Mori et al. |
| 4,981,558 A | * | 1/1991 | Maner |
| 5,592,365 A | * | 1/1997 | Sugimoto et al. |
| 6,089,438 A | * | 7/2000 | Suzuki et al. |
| 6,149,755 A | * | 11/2000 | McNichols et al. |

FOREIGN PATENT DOCUMENTS

| | | |
|---|---|---|
| DE | 19522338 | 1/1997 |
| DE | 19618100 | 11/1997 |
| WO | 9949708 | 9/1999 |

* cited by examiner

Primary Examiner—Tom Dunn
Assistant Examiner—Jonathan Johnson
(74) Attorney, Agent, or Firm—Roland Plottel

(57) ABSTRACT

The invention relates to the methods which make it possible to establish contacts between two conductive layers separated by an insulating layer.

It consists in pressing the complex (101) formed by these three layers between a sonotrode (105) excited by ultrasound perpendicular to the plane of the complex and an anvil (106) whose face in contact with the complex has protruding ridges (107). Under the effect of the pressure and the ultrasound, the ridges deform the complex and make the insulating layer flow. When the conductive layers come into contact, after contraction of the insulating layer, they become welded to one another under the effect of the ultrasound.

It makes it possible to obtain, at low cost, completely ohmic contacts between these two conductive layers.

5 Claims, 3 Drawing Sheets

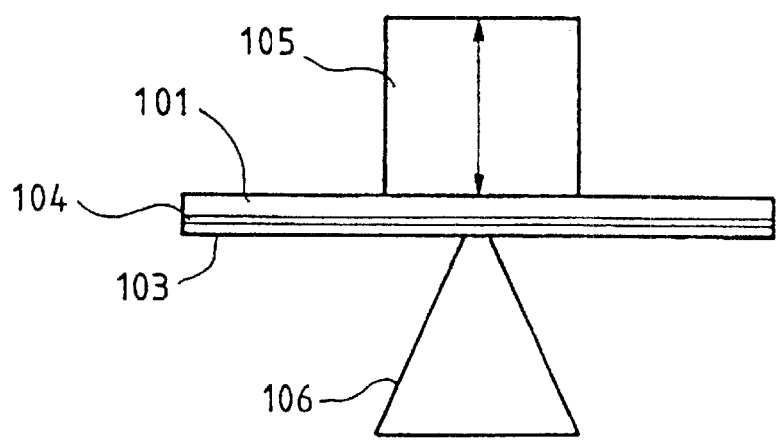
FIG_1a
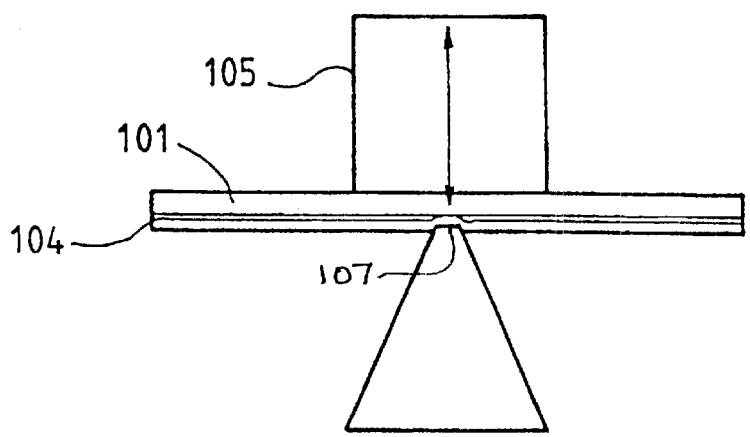
FIG_1b
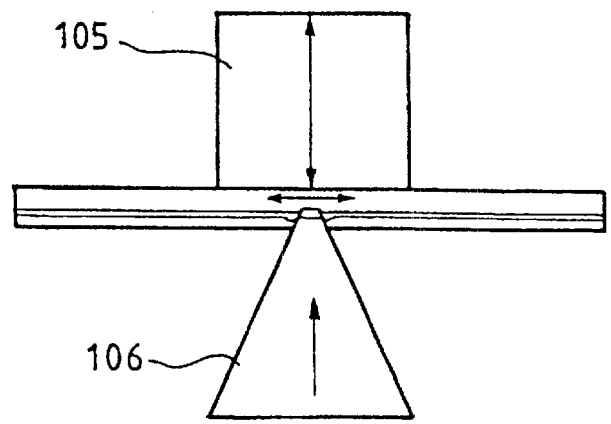
FIG_1c

FIG_2
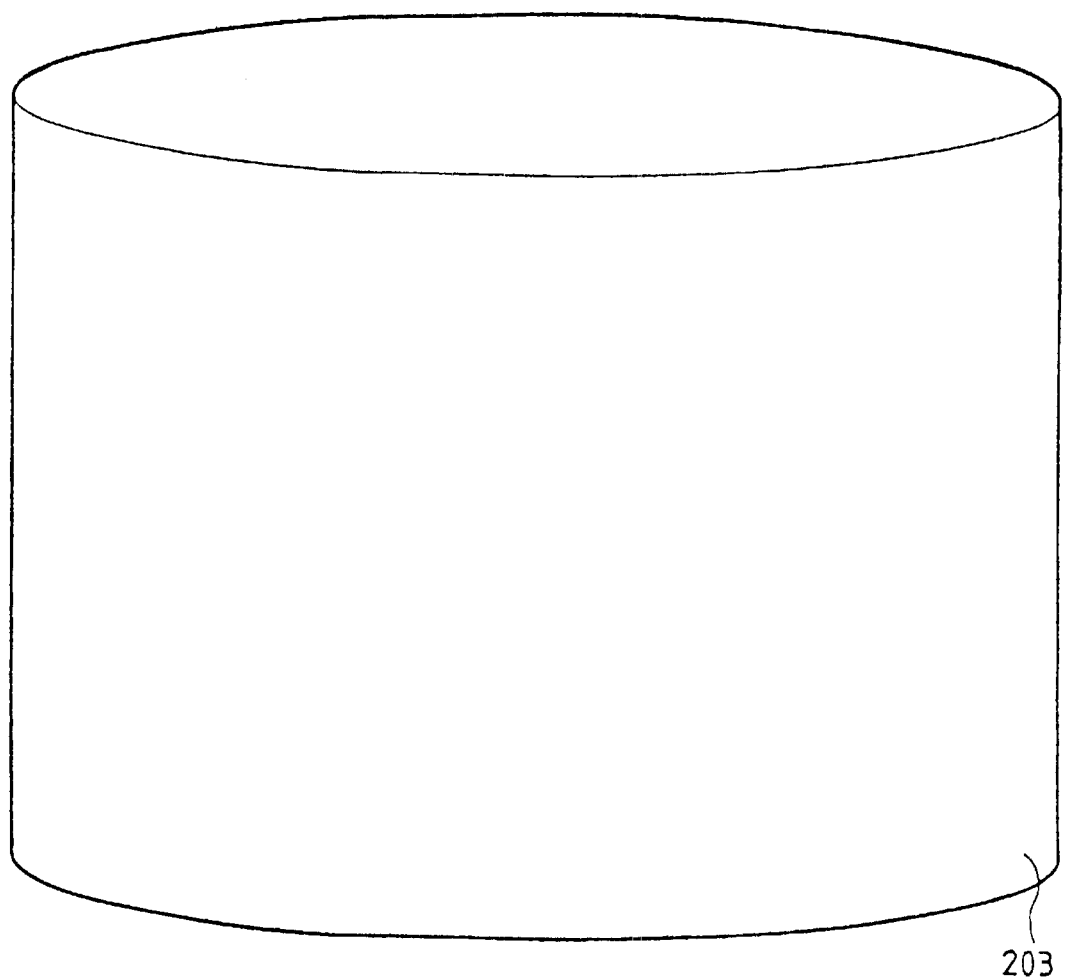
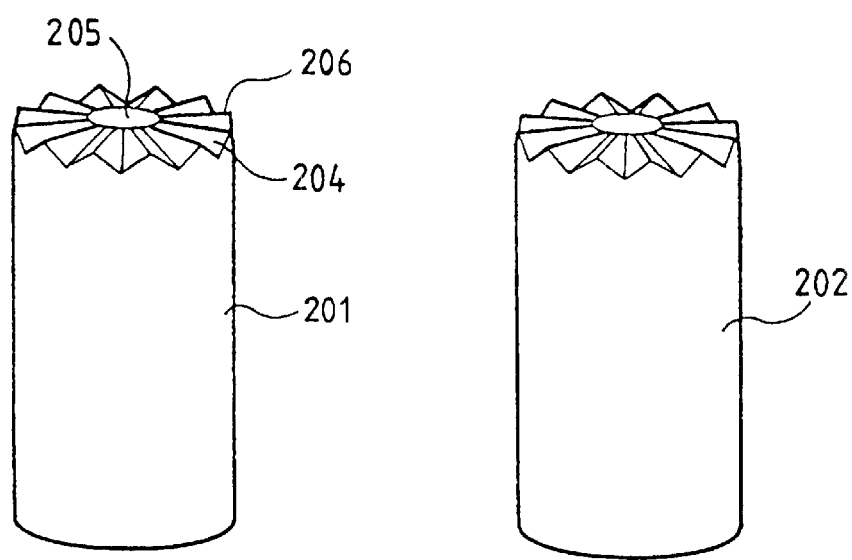

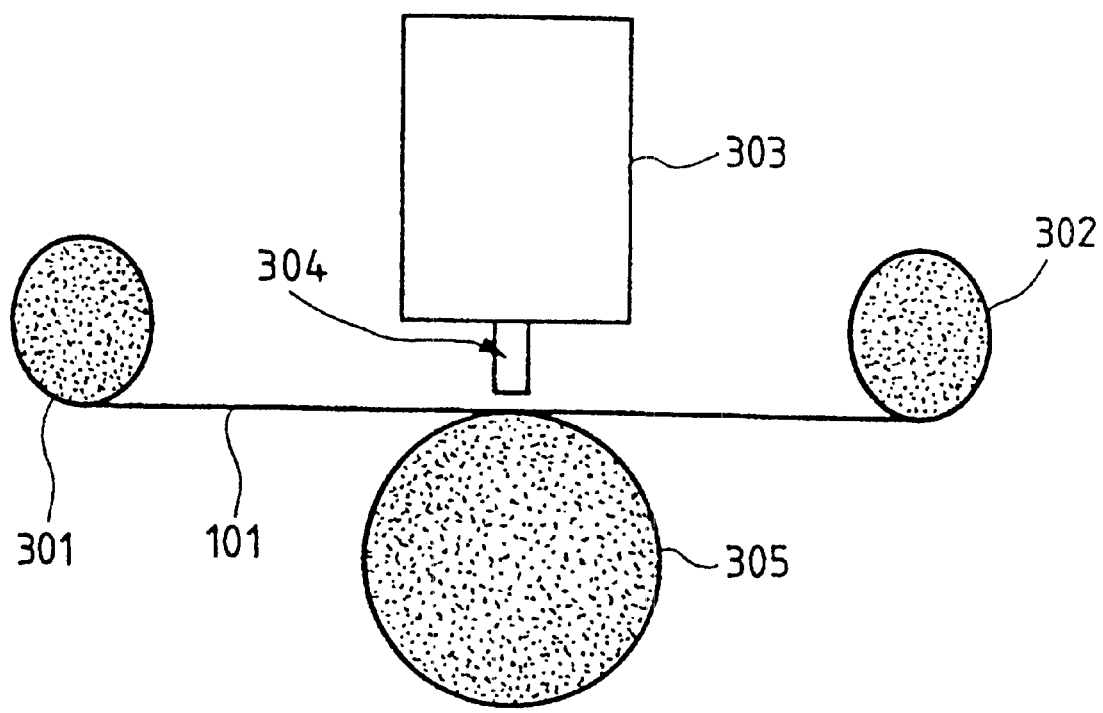

METHOD FOR PRODUCING CONTACT BETWEEN TWO CIRCUIT LAYERS SEPARATED BY AN INSULATING LAYER

The present invention relates to the methods which make it possible to produce contacts between two conductive layers separated by an insulating layer.

More particularly, the invention concerns a simple, quick and very low cost method of producing ohmic or thermal contacts between two conductive layers separated by a less conductive layer.

Contact, in the context of the following description, must be taken to mean any area of connection between two layers which preferentially allows the passage of a current (ohmic contact) or heat (thermal contact) between these two more conductive layers separated by an intermediate layer of lower conductivity, the set of all the layers being referred to hereinafter as the system and the intermediate layer being referred to hereinafter as the support.

The more conductive layers can for example be metallic multilayers, or films, or metallic patterns, made of aluminium, copper or an alloy.

The intermediate layer can for example be an adhesive film, a dielectric, an insulating film, an extruded layer, a polymer or any other material having dielectric and/or conductive properties, any layer of lower resistivity providing insulation between the two more conductive layers, or a set of a number of layers of this type.

The present application more particularly concerns the double-sided flexible printed circuit type multilayer systems which comprise metallic patterns on either side of a support dielectric, it being necessary to connect said patterns ohmically at certain points in order to provide the functionality of the circuit.

The simplest contact methods, for example by stamping, just consist of a physical (mechanical) contact between the conductive layers.

These quick and inexpensive methods are generally sufficient for systems which are not greatly stressed mechanically or those requiring a low reliability or little constrained as regards thickness, or mechanically robust, operating at low current intensity, or at high frequency, or whose functionality tolerates variation in the ohmic characteristics of the contact, or whose composition favours the relative good quality of the contact.

The contact is produced by tearing of the support and deformation of the layers. This is for example the case of the method of producing contacts used in the antitheft circuits which are found in stores. The dielectric is highly elastic and has contraction effects favourable to maintaining the physical or proximity contact of the metallic films.

Among the more complex and costly methods, there can be cited the case of the mechanical methods of contact by riveting which consist in adding a part which will make the mechanical connection by clamping. The contact is produced by tearing of the support and contact is made by an added element.

For the most complex, and the most costly, methods, contacts of good ohmic quality are obtained, but at the price of a method which is elaborate and constraining as regards the chronological sequence of the steps constituting the system itself, and the choice of materials for this system. The contact is produced by opening of the support and formation of intermetallic compounds. The principle of these methods is adhesive force.

This is for example the case of semiconductor or hybrid multilayer type contact methods, which consist in opening vias in the intermediate support of the system, these vias opening out on to the first metallic layer, and in there depositing a metallic alloy constituting the second conductive layer of the system, these steps often being supplemented by a heat treatment allowing optimization of the intermetallic connection in the via.

Among these complex and costly methods, there are also those which make it possible to obtain contacts of good ohmic quality on contactless prefabricated systems, but at the price of additional, often costly and difficult, steps and a supply of additional intermediate material making it possible to provide the inter-layer connection, the performance of this connection, its preservation over time and its reliability. The contact is produced by cutting of the support and addition of an intermediate material. The principle of these methods is gluing.

This is for example the case of the methods of manufacturing contacts in printed circuits, which consist in opening vias in the support separating the conductive layers and in there depositing a metallic alloy forming the contact; the method often being supplemented by a heat treatment allowing optimization of the intermetallic connection between the conductive layers. There will also be cited for example the solutions used for the most recent flexible printed circuit systems, for which cutting is used for opening vias, and conductive glues are used as intermediate material, the overflows of this material providing the contact.

A major problem of the "mechanical contact" methods or those of the "intermetallic compound contact" type is the impossibility of simultaneously obtaining good ohmic contacts and very low production costs, essential for certain applications or for certain products.

The weakness of purely mechanical contacts lies in the transience of the contact, dependent on the quality of the stamping or the "riveting". Pressure is the basic principle of these methods. The presence of an intermediate initially with no via reduces the quality of the contact. Environmental constraints, like for example a subsequent lamination, are also detrimental to the reliability of these contacts. Finally, the choice of the support material is one of the limiting factors and the key to the reliability of this type of contact.

In the prior art, the low cost/performance duality of the contact was not accessible until now.

The invention proposes a production method making it possible to obtain good reliable contacts on multilayer systems having at least two conductive layers separated by at least one intermediate layer of lower conductivity (like for example an insulating support), while keeping very low production costs.

The object of the present invention is more particularly a method of producing at least one contact between two conductive layers separated by an insulating layer, principally characterised in that the complex formed by these layers is pressed between a means excited by ultrasound applied perpendicular to the face of the complex, and a fixed means whose face resting on the complex has at least one protruding part capable of deforming the complex during application of the ultrasound in order to allow flowing and opening of the insulating layer in the region of each protruding part, and then bringing into contact and welding of the metallic layers in the region of this same protruding part.

According to another characteristic, pressure is maintained between the means excited by the ultrasound and the fixed means after stopping of the application of the ultrasound which allowed the flowing of the insulating layer, until the insulating layer has cooled and solidified.

According to another characteristic, the surface of the fixed means bearing each protruding part has radial triangular channels joined by protruding ridges.

According to another characteristic, the method consists in transferring the complex between a delivery roller and a receiver roller, the fixed means having the form of a rotary roller whose axis is parallel to that of the delivery rollers and winders and whose lateral face is etched and turns at the same speed adapted to that at which the complex travels past.

The invention brings together the advantages of the mechanical methods, since no material is supplied and the method is quick, and the advantages of the intermetallic compound contact methods, since it results in a metallic interpenetration of the layers to be connected.

The invention, particularly well adapted for keyboards produced with flexible printed circuits, or for microelectronic chip transponders based on printed circuit type resonant circuits, applies to any type of system.

The invention opens possibilities of simultaneous and direct contacts between electronic devices and conductive film systems.

The object of the invention is a method of localized shearing of the system to be provided with contacts, followed by heating and the formation of an ultrasonic weld type contact in the areas where the conductive layers are in physical contact. The form of the tool and its material are carefully designed to allow all the following: cutting, heating of the support, bringing the conductive layers situated on either side of the support to face one another, and their welding.

Preferentially, the system has a thermoplastic support of thickness less than 100 micrometers (typically 25 micrometers) and metallic patterns made of aluminium, copper, or metallic alloy, of thickness less than a few tens of micrometers (typically between 10 and 50 micrometers), situated on either side of the support.

In a preferred embodiment, the method is implemented on a single item of equipment which makes it possible to produce a number of contacts simultaneously, in step by step mode. A variant embodiment consists in producing the contacts continuously on roller or cut sheet systems.

The production of welded contacts through an insulating support has many advantages, making it possible to eliminate all or some of the problems cited previously. This is because, in this case, the contact is completely ohmic (resistance less than 0.1 milliohm), and mechanically resistant to lamination, thermal cycling, and the mechanical constraints of the products cited above (keyboard, etc.).

Thus, the problem of contact reliability is solved.

Another advantage is the fineness of the contact, the localized deformation of which can be reduced to minimum values, less than for example 200 micrometers.

In a more complex case, the multilayer system has two metallic layers, for example made of aluminium, separated by an insulating layer, for example made of PET.

The invention will be better understood, and other features and advantages will emerge, from a reading of the following description, this description referring to the accompanying drawings, among which:

FIGS. 1a to 1c depict transverse sections of the means used during the three phases of implementation of the method according to the invention;

FIG. 2 depicts an isometric projection view of a means excited by ultrasound and of two fixed means used to implement the method according to the invention;

FIG. 3 depicts a schematic sectional view of a variant embodiment of equipment for implementation of the method according to the invention in a continuous technique.

FIGS. 1a to 1c depict the different steps of implementation of the method according to the invention in the simple case of a single weld of substantially round form making it possible to electrically interconnect the upper and lower faces of a multilayer complex.

This multilayer complex 101 is formed from a conductive upper metallic layer 102 and a lower conductive metallic layer 103, separated by a fusible insulating layer 104. It is installed, as depicted in FIG, 1a, between an active part 105 which is the means excited by ultrasound known by the name "sonotrode" and the fixed means 106 referred to subsequently by the term "anvil", the two parts being disposed one above the other.

The sonotrode, according to the known art, is a part which can be set vibrating by an ultrasound generator. In the case of the invention, this ultrasound makes the sonotrode vibrate longitudinally, therefore from bottom to top in FIG. 1b.

The upper face of the anvil 106 is notched in a way which will be described later and which is depicted in the figure by a serration 107, the points of which are directed towards the lower plane face of the sonotrode.

After this installation phase, depicted in FIG. 1a, the device is put into operation in such a way that the ultrasound makes the sonotrode 105 vibrate during its descent or as soon as it is put in contact with the complex. The complex is put under pressure between the sonotrode and the anvil 106, the anvil resting on the lower face of the complex 101.

Under the effect of the ultrasound, the complex heats up and the thermoplastic layer 104 softens. The duration of application of the ultrasound, its amplitude and its frequency are determined according to the characteristics of the complex 101 with, if need be, a few tests which are easy and quick to implement.

The complex 101 being thus softened, the protruding parts of the upper end of the anvil deform it as the sonotrode approaches the anvil.

While the two metallic layers are simply deformed without undergoing tearing, the central thermoplastic layer flows in the region of these protruding parts; the combination of the flowing and the softening allows the two metallic layers to be brought together in this region.

Finally, tangential forces then bring about creep and welding of the two metallic layers (by surface interpenetration).

When welding is obtained, operation of the sonotrode is stopped while maintaining the pressure between the anvil and the sonotrode, as depicted in FIG. 1c.

This pressure is maintained, as depicted in FIG. 1c, during the time necessary for cooling and resolidification of the thermoplastic layer. At the end of this cooling, the weld 108 is preserved, the intermediate thermoplastic layer around them being solidified at the places where it was pushed out.

FIG. 2 depicts, by way of example, two identical particular anvils 201 and 202, placed under a common sonotrode 203, said sonotrode not having any specific characteristics.

These two anvils are, by way of example, of cylindrical form and have at their upper part a cut-out in the form of radial notches 204 of triangular section. These notches converge towards the centre of the upper face of the anvil and terminate on a hollowed-out circular part 205, which is essentially provided to facilitate the machining of these notches. The lateral walls of these notches join together at their upper part to form ridges 206, designed to facilitate penetration into the complex, and the flowing and opening of the intermediate plastic layer under the effect of the significant pressure exerted by the ridges.

This machining can be carried out so that the ridges 206 are all in a horizontal plane perpendicular to the axis of the anvil, which is the easiest to do. However, in a preferential embodiment, the machining will be carried out in such a way that the ridges 206 have a downward inclination towards the centre of the upper face of the anvil so as to facilitate their penetrating action into the complex.

In this way, the contact obtained with an anvil having this form will visually represent the form of a set of petals, twelve in the embodiment described, forming rounded triangles whose points are directed towards a common centre.

As depicted in FIG. 2, a large-sized sonotrode can be used in combination with a number of anvils, two in FIG. 2, in order to simultaneously produce a number of contacts. If need be, anvils having different profiles and sections can be used depending on the contacts to be produced.

In the embodiment described above, the method operates essentially discontinuously, in order to form contacts on parts installed and removed one after the other.

In a variant embodiment, depicted schematically in FIG. 3, the invention proposes to use this method to form contacts continuously or almost continuously on a multilayer complex of long length which travels past in an ad hoc system.

For this, this complex is unwound from a delivery roller 301 in order to pass into the welding equipment, and then it is wound on to a receiver roller 302, when the welds have been carried out.

The ultrasonic welding equipment 303 equipped with its sonotrode 304 is placed above one of the faces of the complex unwound between the two rollers.

As for the anvil 305, this is placed under the other face, opposite the sonotrode.

In this variant embodiment, the anvil 305 has the form of a roller whose axis is parallel to that of the delivery and receiver rollers and winders 301 and 302, and it rests permanently on the lower face of the complex while turning to avoid continuous friction on this anvil.

When the place where it is wished to produce a contact on the complex reaches the point of contact between said complex and the anvil 305, the sonotrode 304 is lowered quickly in order to compress, on the fly, the complex 101 between itself and the anvil 305.

In order to be able to produce the contact in the manner described in relation to FIG. 1, the surface of the rotary anvil 305 has an appropriate etching, for example longitudinal grooves, or a set of points which make it possible to obtain the desired deformation.

The ultrasound is applied to the sonotrode 304 with a considerable intensity for a relatively short duration, so as not to interrupt, if possible, the movement of the complex 101 between the delivery roller 301 and the receiver roller 302.

However, depending on the constraints due to the structure, dimensions and characteristics of the materials used, of the complex 101, operation could be step by step, stopping the movement of this complex for just the time necessary for production of the contact. The sonotrode could also be made to accompany the movement of the complex by displacing it linearly at the same speed during the contact step, then bringing it back again when the operations are finished.

The method according to the invention is particularly useful for producing keyboard circuits, more particularly in its continuous version corresponding to FIG. 3.

What is claimed is:

1. A method of producing at least one contact between two conductive layers (102, 103) separated by an insulating layer (104), comprising the steps, making a complex (101) of these layers, pressing said complex between a fixed means (106) and a means (105) excited by ultrasound applied perpendicular to the face of the complex, a face of the fixed means (106) resting on the complex having at least one protruding part (107) with a surface for contacting and for deforming the complex during application of the ultrasound in order to allow flowing and opening of the insulating layer in the region of said at least one protruding part, and then bringing into contact and welding of the metallic layers in the region of said at least one protruding part, wherein said surface (107) of said fixed means protruding part has a smaller cross section than the facing means for exciting by ultrasound (105), whereby precise alignment of the two faces of the two means does not have to be precisely aligned.

2. Method according to claim 1 wherein the fineness of the contact between the two metallic layers where joined is less than 200 micrometers.

3. Method according to claim 1 wherein the surface of the fixed means (201) protruding part has radial triangular channels (204) drawn by protruding ridges (206).

4. A method according to claim 1 characterized in that the complex (101) is transferred between a delivery roller (301) and a receiver roller (302), and in that the fixed means has the form of a rotary roller (305) whose axis is parallel to that of the delivery rollers and winders and whose lateral face is etched and which turns at the same speed adapted to that at which tile complex travels past.

5. The method according to claim 1 wherein said deforming and welding step includes applying pressure and ultrasound, and said welding is obtained after the ultrasound is completed and subsequently continuing to maintain the pressure to allow cooling and resolidification of the thermoplastic layer.

\* \* \* \* \*